United States Patent [19]

Wada et al.

[11] Patent Number: 5,162,047
[45] Date of Patent: Nov. 10, 1992

[54] VERTICAL HEAT TREATMENT APPARATUS HAVING WAFER TRANSFER MECHANISM AND METHOD FOR TRANSFERRING WAFERS

[75] Inventors: Atsushi Wada, Chofu; Hirofumi Kitayama, Aikawa, both of Japan

[73] Assignee: Tokyo Electron Sagami Limited, Kanagawa, Japan

[21] Appl. No.: 789,820

[22] Filed: Nov. 12, 1991

Related U.S. Application Data

[63] Continuation of Ser. No. 572,005, Aug. 24, 1990, abandoned.

[30] Foreign Application Priority Data

Aug. 28, 1989 [JP] Japan .................................. 1-222135

[51] Int. Cl.⁵ ...................... H01L 21/68; B65G 65/00
[52] U.S. Cl. .................................. 29/25.01; 414/404; 414/416; 414/226
[58] Field of Search ............... 29/25.01; 414/404, 405, 414/416, 417, 226; 294/87.1

[56] References Cited

U.S. PATENT DOCUMENTS

| | | | |
|---|---|---|---|
| 4,568,234 | 2/1986 | Lee et al. | 414/404 |
| 4,611,966 | 9/1986 | Johnson | 414/404 |
| 4,699,556 | 10/1987 | Foulke | 414/404 |
| 4,750,857 | 6/1988 | Kochersperger | 414/404 |
| 4,806,057 | 2/1989 | Cay et al. | 414/404 |
| 4,938,655 | 7/1990 | Asano | 414/404 |
| 4,938,691 | 7/1990 | Ohkase et al. | 414/152 |
| 5,048,164 | 9/1991 | Harima et al. | 29/25.01 |

FOREIGN PATENT DOCUMENTS

| | | | |
|---|---|---|---|
| 0209660 | 1/1987 | European Pat. Off. | 29/25.01 |
| 60-124031 | 8/1985 | Japan . | |
| 61-247048 | 11/1986 | Japan . | |

Primary Examiner—Olik Chaudhuri
Assistant Examiner—Ken Horton
Attorney, Agent, or Firm—Oblon, Spivak, McClelland, Maier & Neustadt

[57] ABSTRACT

According to this invention, a method of transferring a plurality of semiconductor wafers between a carrier and a support ring type boat comprises the steps of picking up the semiconductor wafer from the carrier on a station by an arm in a substantially horizontal state, positioning the wafer supported by the arm above a support ring of the boat, positioning a receiver below the support ring, moving the receiver upward to a position where a pin of the receiver reaches the arm through an opening of the support ring, lifting the wafer from the arm by the pin, moving the arm backward from the boat, moving the receiver downward to a position where the wafer is transferred from the receiver to the support ring, and then loading the boat into a heat treatment furnace.

8 Claims, 5 Drawing Sheets

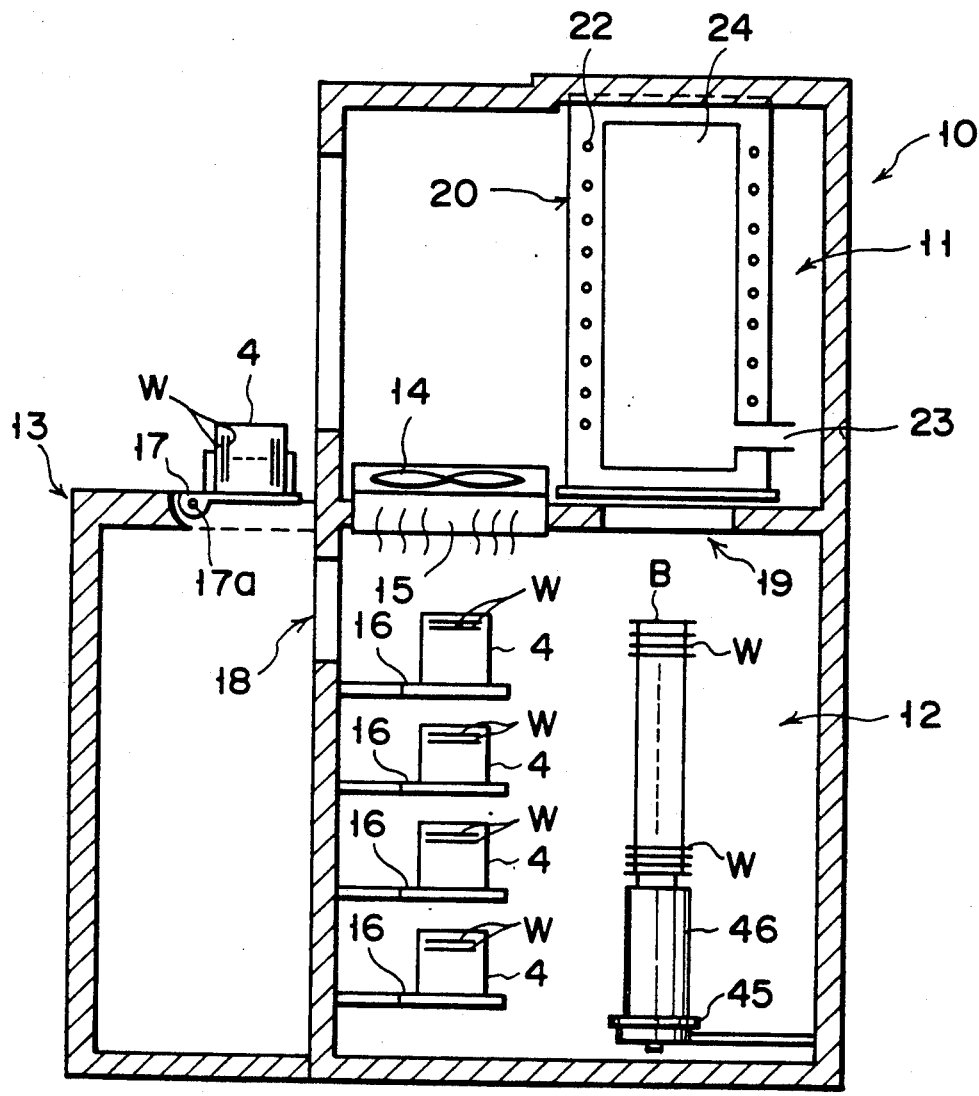
F I G. 1

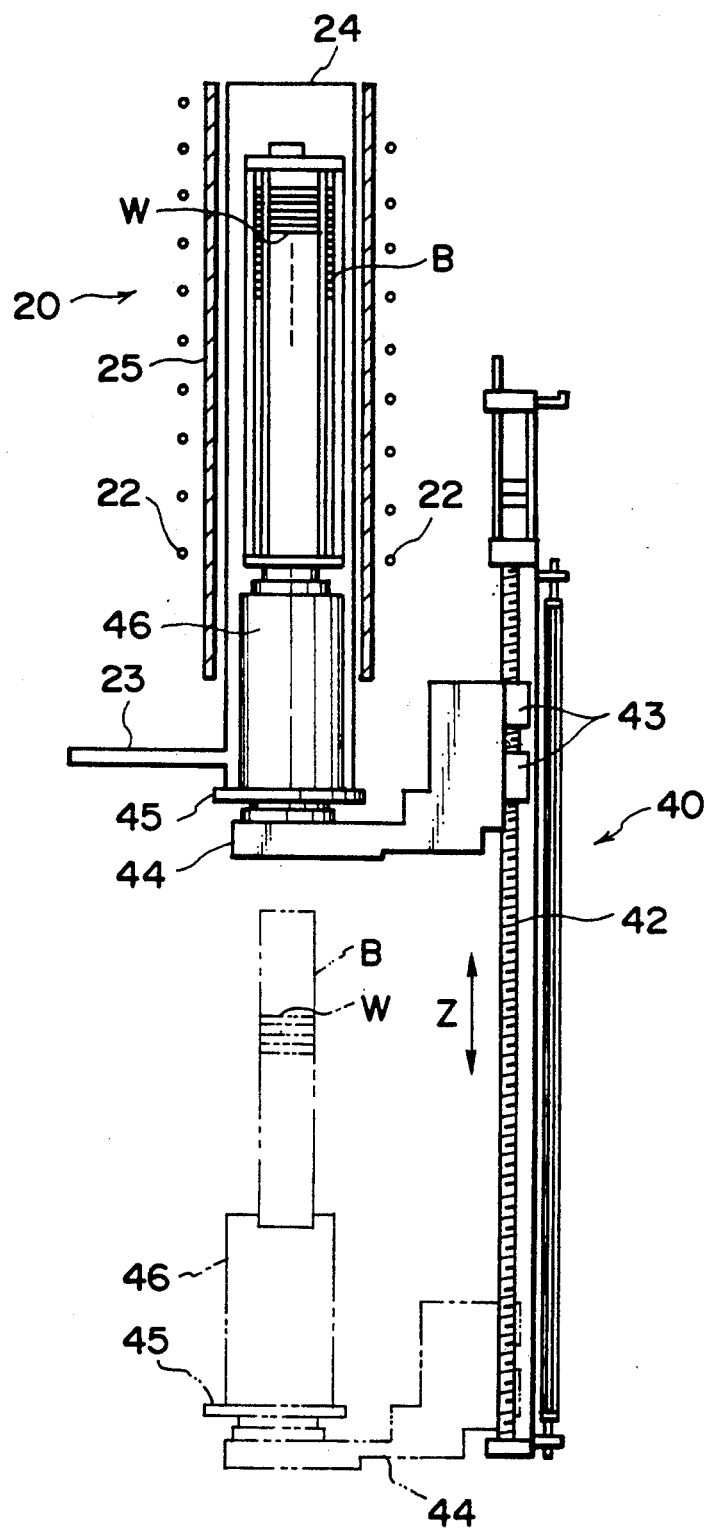
F I G. 2

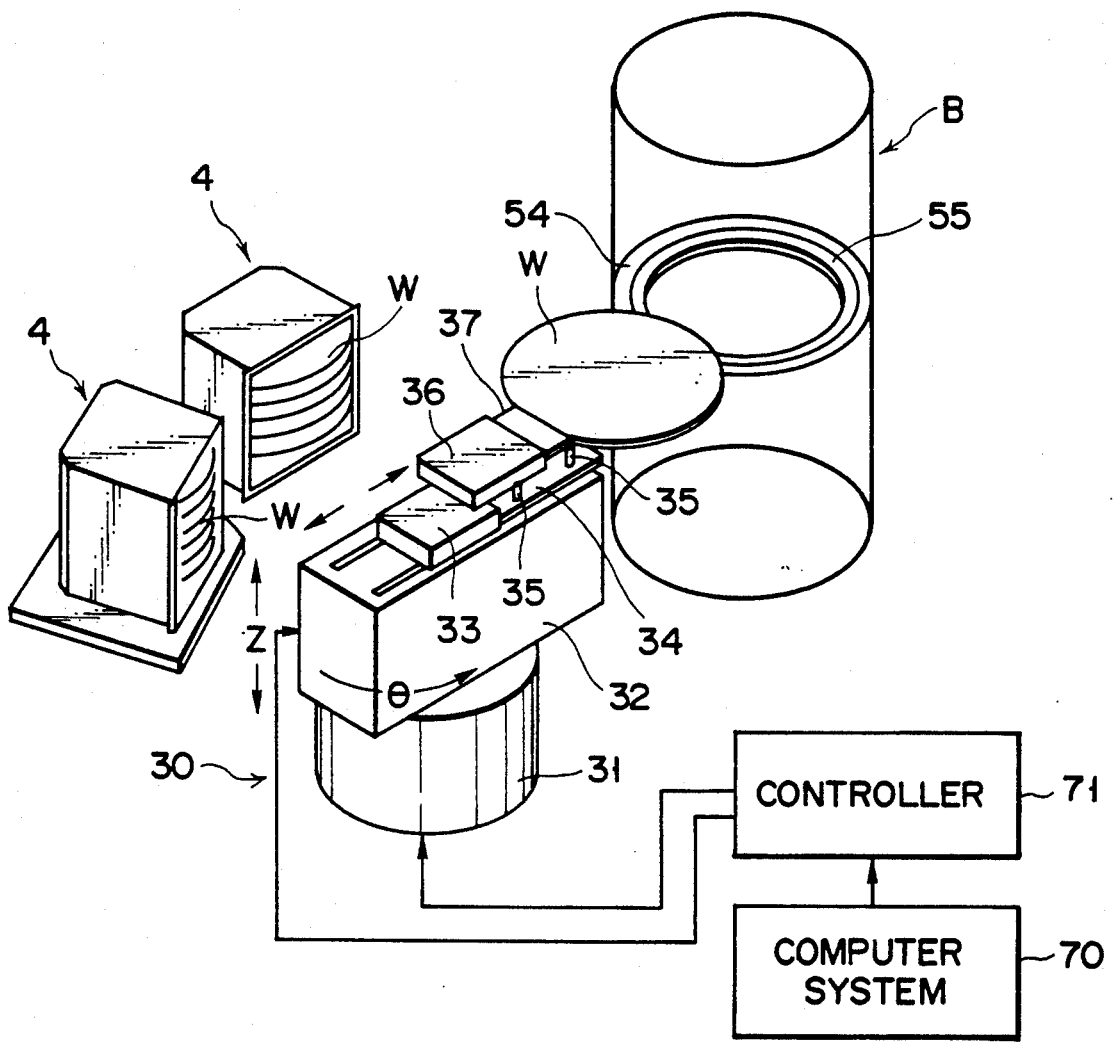
F I G. 3

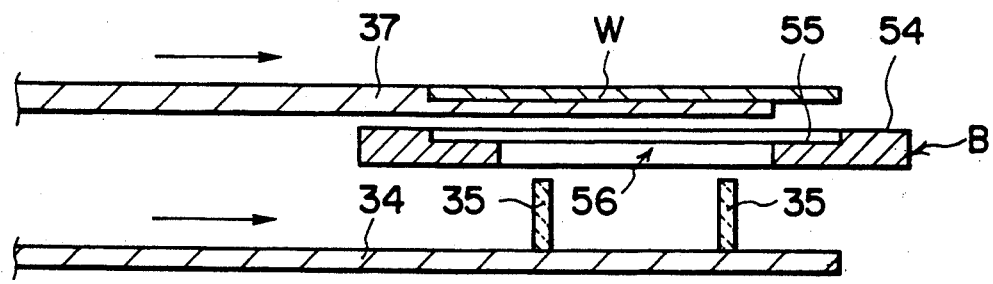
F I G. 7A
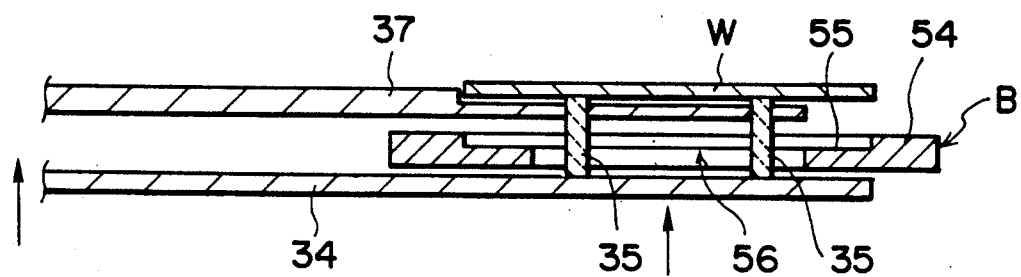
F I G. 7B
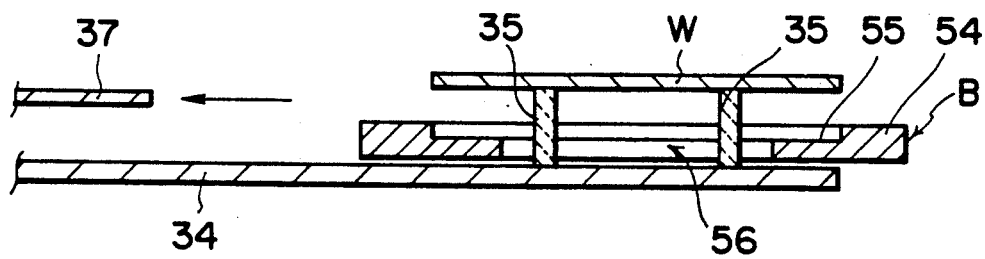
F I G. 7C
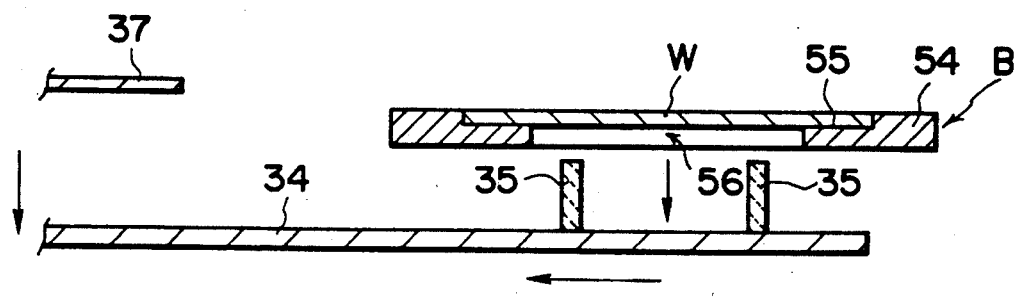
F I G. 7D

VERTICAL HEAT TREATMENT APPARATUS HAVING WAFER TRANSFER MECHANISM AND METHOD FOR TRANSFERRING WAFERS

This application is a continuation of application Ser. No. 07/572,005, filed on Aug. 24, 1990, now abandoned.

BACKGROUND OF THE INVENTION

1. Field of the Invention

The present invention relates to a vertical heat treatment apparatus for thermally treating a semiconductor wafer and, more particularly, to a method of improving a wafer transferring mechanism for transferring a semiconductor wafer between a carrier and a support ring type boat.

2. Description of the Related Art

Since a floor area of a vertical CVD apparatus is smaller than that of a horizontal CVD apparatus, a floor area of a clean room can be effectively used by employing the vertical CVD apparatus. The capacity of the clean room can be decreased, and dust in the room can be exhausted within a short time. Therefore, the vertical CVD apparatus is advantageous for maintaining high cleanness.

According to a vertical CVD apparatus, since a boat can be loaded in or unloaded to a reaction tube without contacting the inner wall of the reaction tube, an amount of dust is advantageously small. Since the vertical CVD apparatus has the above advantage, the vertical CVD apparatus is used for manufacturing not only a VLSI having a memory capacity of 1M bit but a VLSI having a memory capacity of 4M bit.

In recent years, as a semiconductor device is highly integrated, a circuit pattern of the device is three-dimensionally arranged in the thickness direction of the substrate. For this reason, in a manufacturing step of the semiconductor device, various thin films are formed on the substrate, and the thickness of each thin film tends to be decreased. Therefore, film thickness control during film formation must be more strict than conventional control, and film thickness uniformity on a wafer and between wafers must be improved.

Conventionally, when a thin film is formed on a semiconductor wafer W, the peripheral region of the wafer W is thinner than the central region thereof.

In a vertical CVD apparatus, therefore, a boat B having a support ring for supporting wafer is used. According to this, the wafer W is fitted in an inner step portion (concave portion) of the support ring, and the upper surface (pattern forming surface) of the wafer W has the same level as the upper surface of outer step portion of the support ring. A thick film portion is formed on the upper surface of the support ring to uniform the thickness of a pattern forming surface of the peripheral and central region of the wafer W.

However, when the above support ring type boat B is used, a wafer W cannot be automatically fitted in the inner step portion of the support ring. Conventionally, an operator manually sets the wafer W on the boat B. Since this manual setting is an inaccurate operation, an unexpected accident tends to occur. In addition, since a time for continuously opening a body cover is prolonged, an amount of dust entering in a process section is increased to contaminate the semiconductor wafer W, and to increase a rate of defective product.

SUMMARY OF THE INVENTION

It is an object of the present invention to provide a vertical heat treatment apparatus having a wafer transfer mechanism capable for full-automatically transferring a semiconductor wafer between a carrier and a support ring type boat B.

According to an aspect of the present invention, there is provided a vertical heat treatment apparatus having a wafer transfer mechanism for transferring a plurality of semiconductor wafers between a carrier and a support ring type boat, comprising a station on which the plurality of carriers are mounted to horizontally arrange the semiconductor wafers, wafer convey means, which has an arm for picking up and conveying the semiconductor wafer from the carrier of the station, for moving the arm above a support ring of the boat, wafer receiving means, which has a receiver for receiving the semiconductor wafer from the arm, for moving the receiver below the support ring, and boat loading means for loading the boat into a heat treatment furnace. The receiver has at least three support pins for supporting the semiconductor wafer, and the support pins are provided at positions where the semiconductor wafer is not interfered with the support ring of the boat and the arm when the semiconductor wafer is transferred from the arm to the receiver through an opening of the support ring.

As a mechanism for driving the wafer convey means and the wafer receiving means, a belt mechanism is preferably employed. Other mechanisms, e.g., a gear mechanism which produces a small amount of dust and allows easy maintenance may be used.

It is preferable that the wafer convey means has a horizontal adjusting mechanism for adjusting a horizontal state of the arm. Since the arm is accurately horizontal, semiconductor wafer can be smoothly picked up from the carrier in the station.

In addition, it is preferable that a rotating mechanism for rotating a unit having an assembly constituted by the wafer convey means and the wafer receiving means in the horizontal plane is provided. It is preferable to arrange a lift mechanism for vertically moving the unit having the assembly constituted by the wafer convey means and the wafer receiving means along the boat. Therefore, the assembly unit can be smoothly moved between the carrier station and the boat by the rotating mechanism and the lift mechanism.

It is preferable to provide a control means for controlling the wafer receiving means and the wafer convey means such that the wafer receiving means is sequential controlled or interlocked with the wafer convey means.

The receiver need only have at least three support pins. As the number of pins is increased, the wafer becomes stable. However, when the number of pins on the receiver is increased, and the pins easily collide with the support ring. Conventionally, four support pins are preferably arranged on the receiver.

The arm of wafer convey means may have various shapes. However, in order to prevent interference between the arm and the support pin of the receiver, it is preferable that the arm is made of an elongated narrow plate.

As a result, each interval between support pins must be smaller than the diameter of the opening (inner diameter of inner step portion) of the support ring and larger than the width of the arm.

The support pin is preferably made of quartz or SiC. Even when these materials directly contact a semiconductor wafer at a high temperature, they can withstand the high temperature and have a satisfactory strength.

According to an aspect of the present invention, there is provided a method of transferring a plurality of semiconductor wafers between a carrier and support ring type boat, comprising the steps of picking up the semiconductor wafer from the carrier on a station by an arm in a substantially horizontal state, positioning the semiconductor wafer supported by the arm above a support ring of the boat, positioning a receiver below the support ring, moving the receiver upward to a position where a support pin of the receiver reaches the arm through an opening of the support ring, lifting the semiconductor wafer from the arm by the support pins, moving the arm backward from the boat, moving the receiver downward to a position where the semiconductor wafer is transferred from the receiver to the support ring, and loading the boat into a heat treatment furnace.

In this case, the receiver is preferably controlled to be interlocked with the transfer arm by a computer system. According to this computer control, sequence wafer transfer operations are smoothly performed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a longitudinal vertical schematic view showing a whole vertical CVD apparatus;

FIG. 2 is a longitudinal vertical schematic view showing a main part of the vertical CVD apparatus;

FIG. 3 is a schematic view showing a wafer transfer mechanism for transferring a semiconductor wafer from a carrier to a boat B;

FIGS. 7A to 7D, each, is a longitudinal sectional view showing a transfer arm and a receiver moved in accordance with an operation viewed in a direction perpendicular to that in which the wafer is transferred.

DETAILED DESCRIPTION OF THE PREFERRED EMBODIMENTS

Figure 4:
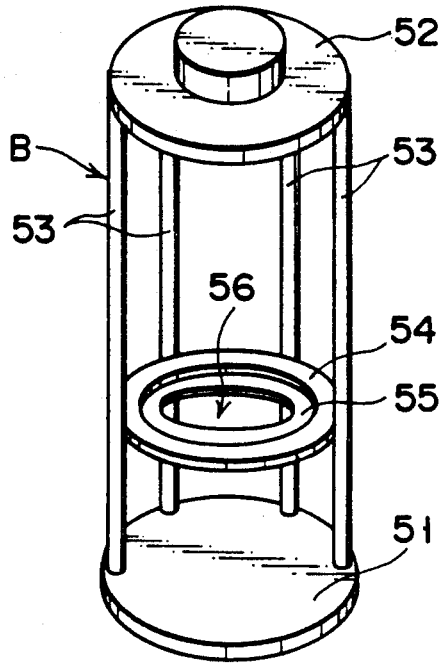
FIG. 4 is a schematic view showing a support ring type boat B.

Various embodiment of the present invention will be described below with reference to the accompanying drawings.

A vertical CVD apparatus 10 is a fully automatic machine which is provided in an unmanned clean room and backed up by a computer system, and all the operations of the apparatus are automatically controlled.

As shown in FIG. 1, the vertical CVD apparatus 10 has a process section 11 and a wafer transfer section 12. The process section 11 is provided in the upper portion of the apparatus 10, and the wafer transfer section 12 is provided in the lower portion of the apparatus 10. A fan 14 having a filter 15 is provided between the process section 11 and the wafer transfer section 12. The fan 14 is provided immediately above a carrier station 16 in the wafer transfer section 12 and supplies clean air to the station 16 during transfer of semiconductor wafers W. Note that, as the filter 15, an HEPA filter or a ULPA filter is used.

A carrier port 13 is formed in the front side of the wafer transfer section 12. The carrier port 13 is formed to cause a plurality of carriers 4 to be received in the CVD apparatus 10. A track (not shown) for traveling a robot is installed. The robot (not shown) conveys the carriers from another apparatus to the port 13 and transfers them to the port 13. Note that a maximum of 25 semiconductor wafers W can be stored in the carrier.

The semiconductor wafers W are arranged such that the pattern forming surfaces of the wafers are vertically arranged in the carrier 4 during reception of the port. A movable base 17 of a posture change mechanism is provided on the upper portion of the port 13. The movable base 17 is provided rotatably about a shaft 17a. When the carrier 4 is rotated with the movable base 17 about the shaft 17a through an angle of 90°, the vertical arrangement of the pattern forming surfaces of the wafers W are changed into a horizontal arrangement.

The wafer transfer section 12 and the carrier port 13 communicate with each other through an opening 18. A carrier transfer mechanism (not shown) is provided near the opening 18. The carrier transfer mechanism has a drive mechanism for moving the carrier in X, Y, and Z directions and a $\theta$ rotational direction. The carrier 4 posture of which is changed is transferred from the port 13 to the station 16 of the wafer transfer section 12 through the opening 18 by the carrier transfer mechanism.

Referring to FIG. 2, a vertical furnace 20 will be described below.

A reaction tube 24 wound with a coil heater 22 is stored in the process section 11, and the reaction tube 24 has a closed upper end and an open lower end. The lower opening of the reaction tube 24 communicates with the wafer transfer section 12 through an opening 19.

A cover 45 is provided immediately below the lower opening of the reaction tube 24. A heat insulating cylinder 46 is provided on the cover 45, and a boat B is mounted on the heat insulating cylinder 46. The cover 45 is supported by a support member 44, and a nut 43 of the support member 44 is engaged with a ball screw 42 of a lift mechanism 40. Note that the diameter of the cover 45 is larger than that of the lower opening of the reaction tube 24.

A process gas supply tube (not shown) extends upward along the inner wall of the reaction tube 24. The gas supply tube is connected to a gas supply source (not shown) through a mass flow controller (not shown) of a process gas supply section (not shown). The exhaust tube 23 is provided in the lower portion of the reaction tube 24. The exhaust tube 23 communicates with a suction port of a vacuum pump (not shown). Note that a heat uniforming tube 25, for uniforming a temperature distribution in the reaction tube 24, is connected between the reaction tube 24 and the coil heater 22.

Referring to FIG. 3, a wafer transfer mechanism 30 will be described below.

In the wafer transfer mechanism 30, stepping motors (not shown) are respectively stored in a lower assembly 31 and an upper assembly 32. A circuit of each drive motor is connected to a power supply of a controller 71 backed up by a computer system 70. A clock signal is generated from the system 70 to the controller 71, and the pulse number of the clock signal corresponds to reading (detection value) of an encoder, thereby controlling actions of the mechanism 30.

The lower assembly 31 of the wafer transfer mechanism 30 is attached to the frame of the apparatus 10. The rotating shaft (vertical shaft) of the stepping motor of the lower assembly 31 is connected to the frame of the upper assembly 32 to rotate the upper assembly 32 about a θ-shaft. The lower assembly 31 has an lift mechanism (not shown).

Lower and upper horizontal sliders 33 and 36 are mounted on the upper assembly 32. The sliders 33 and 3 are connected to an internal mechanism to be independently driven along the longitude of the upper assembly 32. A receiver 34 is attached to the distal end of the lower slider 33, and a convey arm 37 is attached to the distal end of the upper slider 36. A horizontal stroke of each of the upper and lower sliders 33 and 36 is about 220 mm.

As a mechanism (not shown) for driving the sliders 33 and 36, a belt mechanism is suitable, because an amount of dust generation is smaller in the belt mechanism than in a gear mechanism.

The receiver 34 has a length of about 100 mm and is made of a Teflon ®coated stainless steel plate. The convey arm 37 has a length of about 100 mm and is made of an alumina plate.

The lower slider 33 is arranged to be vertically moved (moved in a Z-axis direction) by another internal mechanism. A vertical stroke of the lower slider 33 is about 10 mm. Four pins 35 are formed on the upper surface of the receiver 34 in square formation. The pins 35 are made of quartz. The pins 35 may be made of SiC in place of quartz.

Note that, in this embodiment, the four pins 35 are formed on the upper surface of the receiver 34. However, the number of pins is not limited to four, and at least three pins may be used.

The wafer transfer mechanism 30 of this embodiment has a function in which only one wafer W is transferred from a carrier 4 to the boat B. However, the mechanism can be converted into a mechanism in which two or more wafers W can be simultaneously transferred.

Figure 5:
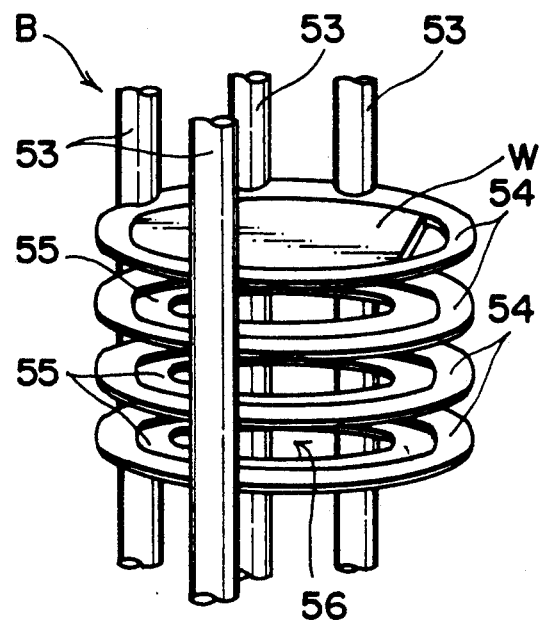
FIG. 5 is a schematic view showing a part of support ring type boat B.
Figure 6:
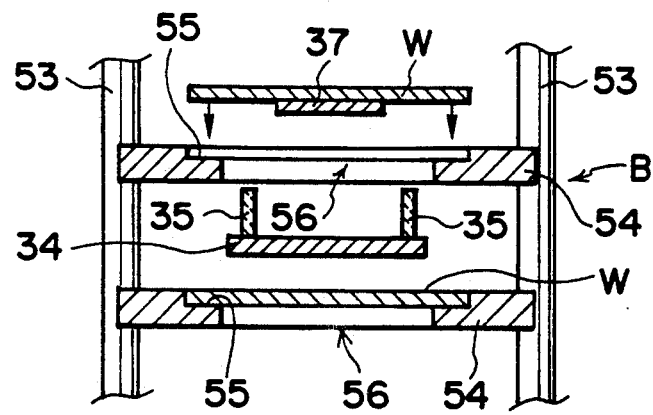
FIG. 6 is a longitudinal sectional view showing a part of boat B and a semiconductor wafer viewed from a wafer transfer direction.

Referring to FIGS. 4 to 6, the boat B will be described below.

The boat B is made of quartz or SiC. A lower end plate 51 and an upper end plate 52 are respectively provided on the lower and upper ends of the boat B, and four support bars 53 are provided between the upper and lower end plates.

As shown in FIG. 5, a large number of support rings 54 are supported by the four support bars 53 at equal intervals. Each interval between the support rings 54 is 13 mm. An inner step portion 55 is formed on each ring 54.

As shown in FIG. 6, the wafers W approach the support rings 54 together with the convey arm 37 from the upper direction of the ring 54, and the receiver 34 approaches the rings 54 from the lower direction of the ring 54. The diameter of the inner step portion 55 is slightly larger than that of the wafer W. The diameter of an opening 56 of the ring 54 is sufficiently smaller than that of the wafer W and larger than the interval between the pins 35. The step difference of the inner step portion 55 of the ring 54 is equal to the thickness of the wafer W. That is, when the wafer W is fitted in the inner step portion 55 of the ring 54, the upper surface of the wafer W has the same level as the peripheral portion of upper surface of the ring 54.

Referring to FIGS. 7A to 7D, a case wherein the semiconductor wafer W is transferred from the carrier 4 to the boat B by the wafer transfer mechanism 30 will be described below.

(I) The carriers 4 are sequentially mounted on the port 13 by the robot. Conditions for transfer and annealing are input to the CPU of the computer system using its keyboard. A maximum of 25 semiconductor wafers W can be stored in each carrier 4. Each semiconductor wafer W has a diameter of 6 inches and a thickness of 0.7 mm.

(II) A command signal from the CPU is supplied to a parallel transfer mechanism (not shown) to operate the transfer mechanism. The carrier 4 is clamped between a pair of arms of the parallel transfer mechanism an is mounted on the movable base 17.

(III) The carrier 4 is clamped between the arms of the posture change mechanism. A rotating roller (not shown) is brought into contact with the wafer W in the carrier 4 to uniform orientation fats of the wafers W. The number of wafers W in the carrier 4 is counted by a wafer counter (not shown). The shaft 17a is rotated in a forward direction to rotate the carrier 4 with the movable base 17 through an angle of 90°.

(IV) A carrier transfer mechanism (not shown) is moved forward toward the carrier 4 to position the pair of clamp arms on the side of carrier 4. The arms of the posture change mechanism are unlocked. The carrier transfer mechanism is moved backward in the section 12 and rotated to position the carrier 4 at the station 16. The clamp arms are unlocked, and the carrier 4 is stayed on the station 16. Note that 4-stage compartments of the station 16 are arranged in two rows. A sensor (not shown) for discriminating whether the carrier is present or not is provided in each compartment of the station 16.

(V) The convey arm 37 is inserted in the carrier 4 to pick up one wafer W from the carrier 4. The upper assembly 32 is rotated to orient the wafer W supported by the convey arm 37 on the boat B side. The upper assembly 31 is vertically moved to position the convey arm 37 at a predetermined level. The upper slider 36 is slid forward to move the convey arm 37 forward toward the boat B.

(VI) As shown in FIG. 7A, the wafer W supported by the convey arm 37 is stopped immediately above the support ring 54. The lower slider 33 is moved forward to position the pins 35 of the receiver 34 immediately below the opening 56. This relative position adjustment is performed on the basis of reading of the encoder and the number of pulses of the clock signal.

(VII) As shown in FIG. 7B, the receiver 34 is moved upward to lift the wafer W from the convey arm 37. At this time, an ascending amount of the receiver 34 is 10 mm.

(VIII) As shown in FIG. 7C, the upper slider 36 is moved backward to retract the convey arm 37 from the boat B.

(IX) As shown in FIG. 7D, the receiver 34 is moved downward to transfer the wafer W from the receiver 34 to the boat B. The wafer W is fitted in the inner step portion 55 of the support ring 54, and the upper surface of the wafer W has the same level as the upper surface of the support ring 54. The lower slider 33 is then moved backward to retract the receiver 34 from the boat B.

(X) Upon completion of loading of the wafers W on the boat B, a boat holding mechanism (not shown) is rotated to transfer the boat B to cover 45. The boat B is moved upward by the lift mechanism 40 to load the boat B in the reaction tube 24. The lower opening of the reaction tube 24 corresponding to the boat B is closed by the cover 45. Thereafter, the reaction tube 24 is heated by the heater 22 to form a thin film having a predetermined thickness and placed on the boat B. The thickness of the thin film in this manner corresponds to ±3% of the target value. Therefore, these thin films have a substantially uniform thickness. Note that, after heat processing, operations opposite to those described above are performed to transfer the wafer W from the boat B to the carrier 4.

The above embodiment examplifies transfer of semiconductor wafers W to the boat B one by one. However, a multistage arrangement consisting of identical apparatuses may be provided to simultaneously transfer a plurality of wafers to the boat B.

According to the above embodiment, the wafer W can be accurately fitted in the inner step portion of the boat B without contacting the wafer W on the boat B.

In addition, according to the present invention, when the wafer W is transferred from the convey arm 37 to the receiver 34, the wafer W contacts only pins 35 to minimize a contact area of the wafer W. Therefore, an amount of dust produced during transfer is small.

An effect of the present invention will be summarized below.

According to the present invention, the semiconductor wafer W can be appropriately transferred from the carrier to the support ring type boat B.

After the wafer carrier is received in the CVD apparatus from the outside, the wafer W can be processed in an unmanned state, and entrance of dust into the process section can be greatly reduced, thereby effectively preventing contamination of the semiconductor wafers W. Therefore, a ratio of defective products of semiconductor devices to non-defective products can be reduced.

Additional advantages and modifications w 11 readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

What is claimed is:

1. A wafer transfer apparatus for transferring a semiconductor wafer between a boat and a cassette for loading wafers, said boat having a plurality of wafers horizontally loaded therein and having at least two support rings each having an opening smaller in diameter than the wafer, comprising:
   a station having a cassette mounted thereon;
   convey means provided with a plate-like arm for taking out and transferring the wafer from the cassette mounted on said station, and horizontally moving said arm to a region above the opening of the support ring;
   receiving means provided with a receiver for receiving the wafer from the arm and horizontally moving said receiver to a region below the opening of the support ring;
   means for vertically moving the receiver;
   a projecting member mounted on the receiver for supporting the wafer; and
   a common assembly frame having both the receiver and the arm mounted thereon movably in the same direction.

2. A method of transferring a semiconductor wafer between a cassette and a boat including at least two support rings coaxially arranged with a predetermined pitch between each of the support rings and each provided with an opening having a diameter smaller than that of the wafer, comprising the steps of:
   picking up the wafer from the cassette on a station by an arm in a substantially horizontal state;
   inserting the arm into the boat for positioning the wafer supported by said arm above an opening of the support ring;
   allowing a receiver and said arm to approach the boat in the same direction for positioning the receiver below said opening of the support ring;
   moving said receiver upward to a position where a projecting member mounted on said receiver reaches said arm through the opening of the support ring;
   lifting the wafer from said arm by said projecting member;
   moving said arm to retreat from said boat;
   moving said receiver downward to a position where the wafer is transferred from said receiver to said support ring; and
   loading the wafer on the support ring such that a distance between a top face of a first wafer and a bottom face of a second wafer is larger than a distance between a top face of a first support ring and a bottom face of a second support ring.

3. A wafer transfer apparatus according to claim 1, further comprising second means for vertically moving said assembly frame.

4. A wafer transfer apparatus according to claim 1, further comprising rotating means for rotating the assembly frame within a horizontal plane.

5. A wafer transfer apparatus according to claim 1, further comprising elevator means for vertically moving the boat.

6. A wafer transfer apparatus according to claim 1, wherein said projecting member consists of at least three pins.

7. A wafer transfer apparatus according to claim 1, wherein the height of said projecting member is greater than the sum of the thickness of the support ring and the thickness of the plate-like arm.

8. A method of transferring a semiconductor wafer according to claim 2, further comprising the step of loading the boat into a heat-treating furnace.

* * * * *